(12) United States Patent
Padmanabhan et al.

(10) Patent No.: US 10,755,931 B2
(45) Date of Patent: *Aug. 25, 2020

(54) SEMICONDUCTOR DEVICE AND METHOD OF FORMING INCLUDING SUPERJUNCTION STRUCTURE FORMED USING ANGLED IMPLANT PROCESS

(71) Applicant: Alpha and Omega Semiconductor Incorporated, Sunnyvale, CA (US)

(72) Inventors: Karthik Padmanabhan, San Jose, CA (US); Madhur Bobde, Santa Clara, CA (US); Lingpeng Guan, San Jose, CA (US); Lei Zhang, Shanghai (CN); Hamza Yilmaz, Saratoga, CA (US)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/356,630

(22) Filed: Mar. 18, 2019

(65) Prior Publication Data
US 2019/0214261 A1    Jul. 11, 2019

Related U.S. Application Data

(63) Continuation of application No. 15/423,154, filed on Feb. 2, 2017, now Pat. No. 10,276,387, which is a
(Continued)

(51) Int. Cl.
*H01L 21/265* (2006.01)
*H01L 29/78* (2006.01)
(Continued)

(52) U.S. Cl.
CPC ...... *H01L 21/26586* (2013.01); *H01L 21/324* (2013.01); *H01L 29/0634* (2013.01);
(Continued)

(58) Field of Classification Search
CPC ............. H01L 21/26586; H01L 21/324; H01L 29/0634; H01L 29/0661; H01L 29/0676;
(Continued)

(56) References Cited

U.S. PATENT DOCUMENTS 4,754,310 A     6/1988  Coe
4,941,026 A  *  7/1990  Temple ............... H01L 29/4236
                                                           257/333
(Continued)

OTHER PUBLICATIONS

Tatsubiko Fujihira, Theory of Semiconductor Superjunction Devices, Jpn. 4. Appl. Phys., Part 1, No. 10, Oct. 1997, pp. 6254-6262.

*Primary Examiner* — Dzung Tran
(74) *Attorney, Agent, or Firm* — Patent Law Works LLP

(57) ABSTRACT

A semiconductor device includes a superjunction structure formed using simultaneous N and P angled implants into the sidewall of a trench. The simultaneous N and P angled implants use different implant energies and dopants of different diffusion rate so that after annealing, alternating N and P thin semiconductor regions are formed. The alternating N and P thin semiconductor regions form a superjunction structure where a balanced space charge region is formed to enhance the breakdown voltage characteristic of the semiconductor device.

13 Claims, 11 Drawing Sheets

Related U.S. Application Data continuation of application No. 14/860,396, filed on Sep. 21, 2015, now Pat. No. 9,595,609, which is a continuation of application No. 14/495,817, filed on Sep. 24, 2014, now Pat. No. 9,171,949.

(51) Int. Cl.

| | | |
|---|---|---|
| *H01L 29/06* | (2006.01) | |
| *H01L 29/08* | (2006.01) | |
| *H01L 29/10* | (2006.01) | |
| *H01L 21/324* | (2006.01) | |
| *H01L 29/66* | (2006.01) | |
| *H01L 29/423* | (2006.01) | |

(52) U.S. Cl.
CPC ...... *H01L 29/0661* (2013.01); *H01L 29/0676* (2013.01); *H01L 29/0696* (2013.01); *H01L 29/086* (2013.01); *H01L 29/0878* (2013.01); *H01L 29/1095* (2013.01); *H01L 29/66689* (2013.01); *H01L 29/7802* (2013.01); *H01L 29/7803* (2013.01); *H01L 29/7816* (2013.01); *H01L 29/7823* (2013.01); *H01L 21/26513* (2013.01); *H01L 29/0653* (2013.01); *H01L 29/42376* (2013.01)

(58) Field of Classification Search
CPC .............. H01L 29/0696; H01L 29/086; H01L 29/0878; H01L 29/1095; H01L 29/66689; H01L 29/7802; H01L 29/7803; H01L 29/7816; H01L 29/7823; H01L 21/26513; H01L 29/0653; H01L 29/42376
USPC ......................................................... 257/337
See application file for complete search history.

(56) References Cited

U.S. PATENT DOCUMENTS

| | | | |
|---|---|---|---|
| 5,216,275 | A | 6/1993 | Chen |
| 5,438,215 | A | 8/1995 | Tihanyi |
| 5,981,996 | A | 11/1999 | Fujishima |
| 6,037,632 | A | 3/2000 | Omura et al. |
| 6,097,063 | A | 8/2000 | Fujihira |
| 6,103,578 | A | 8/2000 | Uenishi et al. |
| 6,509,240 | B2 | 1/2003 | Ren et al. |
| 6,608,350 | B2 | 8/2003 | Kinzer et al. |
| 6,828,631 | B2 | 12/2004 | Rumennik et al. |
| 6,835,993 | B2 | 12/2004 | Sridevan et al. |
| 7,910,486 | B2 | 3/2011 | Yilmaz et al. |
| 8,247,329 | B2 | 8/2012 | Yilmaz et al. |
| 8,299,494 | B2 | 10/2012 | Yilmaz et al. |
| 8,390,058 | B2 | 3/2013 | Yilmaz et al. |
| 8,598,623 | B2 | 12/2013 | Yilmaz et al. |
| 2005/0048701 | A1 | 3/2005 | Minato et al. |
| 2006/0180947 | A1 | 8/2006 | Loechelt et al. |
| 2006/0231915 | A1 | 10/2006 | Hshieh et al. |
| 2006/0273386 | A1* | 12/2006 | Yilmaz ............... H01L 29/7827 257/330 |
| 2007/0034947 | A1 | 2/2007 | Loechelt et al. |
| 2008/0246149 | A1 | 10/2008 | Kwak et al. |
| 2009/0079002 | A1 | 3/2009 | Lee et al. |
| 2010/0059814 | A1 | 3/2010 | Loechelt et al. |
| 2010/0163846 | A1 | 7/2010 | Yilmaz et al. |
| 2010/0314659 | A1 | 12/2010 | Yilmaz et al. |
| 2010/0314682 | A1 | 12/2010 | Yilmaz et al. |
| 2011/0127586 | A1 | 6/2011 | Bobde et al. |
| 2011/0127606 | A1 | 6/2011 | Bobde et al. |
| 2011/0220994 | A1 | 9/2011 | Parekh et al. |

* cited by examiner

SEMICONDUCTOR DEVICE AND METHOD OF FORMING INCLUDING SUPERJUNCTION STRUCTURE FORMED USING ANGLED IMPLANT PROCESS

CROSS REFERENCE TO OTHER APPLICATIONS

This application is a continuation of U.S. patent application Ser. No. 15/423,154, entitled SEMICONDUCTOR DEVICE INCLUDING SUPERJUNCTION STRUCTURE FORMED USING ANGLED IMPLANT PROCESS, filed Feb. 2, 2017, now U.S. Pat. No. 10,276,387, issued Apr. 30, 2019, which is a continuation of U.S. patent application Ser. No. 14/860,396, entitled SEMICONDUCTOR DEVICE INCLUDING SUPERJUNCTION STRUCTURE FORMED USING ANGLED IMPLANT PROCESS, filed Sep. 21, 2015, now U.S. Pat. No. 9,595,609, which is a continuation of U.S. patent application Ser. No. 14/495,817, entitled SEMICONDUCTOR DEVICE INCLUDING SUPERJUNCTION STRUCTURE FORMED USING ANGLED IMPLANT PROCESS, filed Sep. 24, 2014, now U.S. Pat. No. 9,171,949, which patents and patent applications are incorporated herein by reference in their entireties.

BACKGROUND OF THE INVENTION

Semiconductor devices incorporating superjunction structure to achieve improved electrical characteristics are known. For example, metal oxide semiconductor field effect transistor (MOSFET) devices can be incorporated with vertical or horizontal superjunction structure to optimize the on-resistance and the breakdown voltage characteristics of the transistor. As an example, Fujihira describes configurations of the vertical super junction devices in the paper entitled "Theory of Semiconductor Super Junction Devices" (Japan Journal of Applied Physics Vol. 36, October 1997 PP 6254-6262). U.S. Pat. No. 6,097,063 also describes a vertical semiconductor device having a drift region in which a drift current flows if it is in the ON mode and which is depleted if it is in the OFF mode. The drift region is formed as a structure having a plurality of first conductive type divided drift regions and a plurality of second conductive type compartment regions in which each of the compartment regions is positioned among the adjacent drift regions in parallel to make p-n junctions, respectively.

Challenges remain in the manufacturing of superjunction semiconductor devices. These challenges include the difficulties in forming the nanotubes of the superjunction structure, such as inter-diffusions of the N and P impurities in the superjunction structure at high temperatures, difficulties of integrating different devices on a same chip, and high product costs when epitaxial processes are used, among others.

BRIEF DESCRIPTION OF THE DRAWINGS

Various embodiments of the invention are disclosed in the following detailed description and the accompanying drawings.

DETAILED DESCRIPTION

Figure 1:
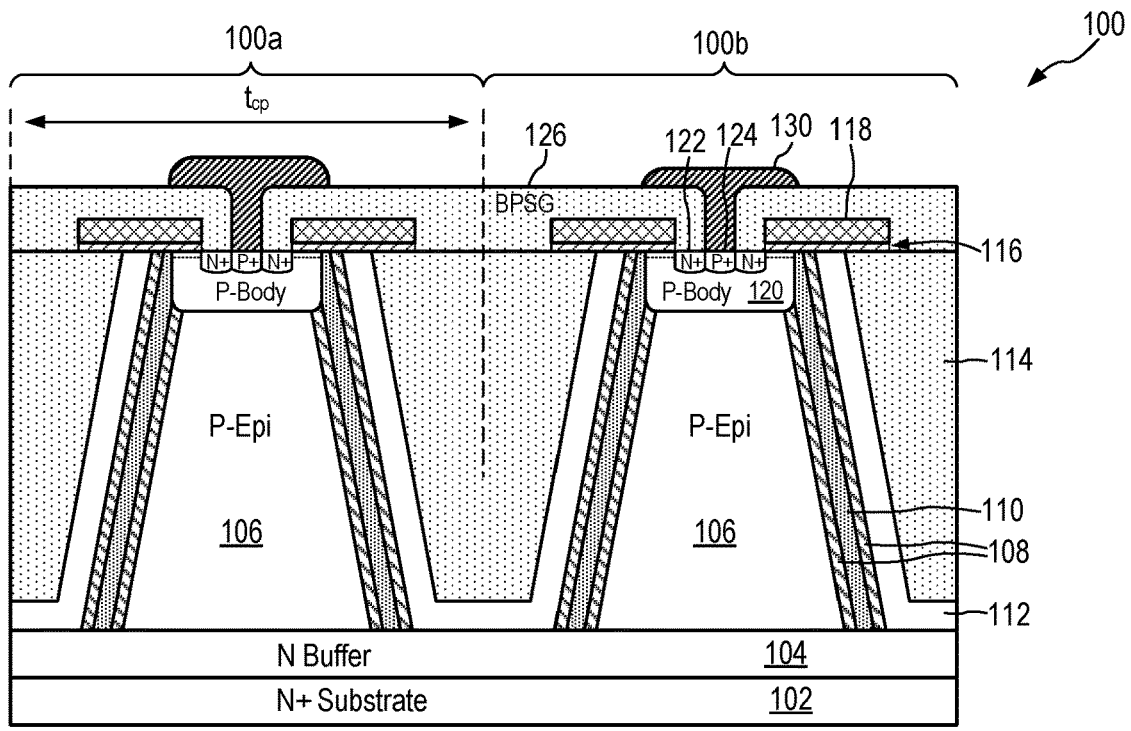
FIG. 1 is a cross-sectional view of a lateral MOSFET device according to a first embodiment of the present invention.

The invention can be implemented in numerous ways, including as a process; an apparatus; a system; and/or a composition of matter. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

According to embodiments of the present invention, a semiconductor device includes a superjunction structure formed using simultaneous N and P angled implants into the sidewall of a trench. More specifically, the superjunction structure includes alternate N and P type thin semiconductor regions formed on the sidewall of the trench. A thin semiconductor region ("nanotube") of a first conductivity type functions as a conduction channel of the semiconductor device and is bordered or sandwiched by thin semiconductor regions ("nanotubes") of a second, opposite conductivity type to form a balanced space charge region for enhancing the breakdown voltage characteristic of the semiconductor device.

In one embodiment, the semiconductor device incorporating the superjunction structure is a lateral MOSFET device of the first conductivity type. The superjunction structure includes a nanotube of the first conductivity type forming a nanotube drain drift region of the transistor and nanotubes of the second conductivity type forming a nanotube body region. The nanotube drain drift region and the nanotube body region can be depleted uniformly to ensure a high breakdown voltage characteristic for the MOSFET device. In other embodiments, the semiconductor device can be a bipolar transistor device or a diode device. The superjunction structure can include a nanotube forming the collector region of the bipolar transistor or a nanotube forming the cathode region of the diode device.

According to alternate embodiments of the present invention, a semiconductor device includes a superjunction structure formed using sequential angled implant of the first conductivity type and epitaxial growth with a final angled implant of the second conductivity type to form alternate N and P type thin semiconductor regions ("nanotubes") on the sidewall of the trench. In this manner, a superjunction structure with multiple conduction channels is realized. More specifically, the superjunction structure includes nanotubes of the first conductivity types forming the conduction channels and nanotubes of the second conductivity type forming the nanotube body regions. The nanotube conduction channels are formed interleaved with and bordered by the nanotube body regions. The superjunction structure with multiple conduction channels improves the on-state resistance of the semiconductor device.

FIG. 1 is a cross-sectional view of a lateral MOSFET device according to a first embodiment of the present invention. Referring to FIG. 1, an N-type lateral MOSFET device ("NMOS transistor") 100 is formed in an array of parallely connected transistor cells 100a and 100b. A desired number of transistor cells are used to form the array to realize an NMOS transistor 100 having the desired breakdown voltage and Rdson (drain-to-source "On" resistance) characteristic. The transistor array can be a 1-dimensional or 2-dimensional array depending on the number of transistor cells involved. For instance, a stripe cell structure can be used for a 1-dimensional array and a hexagonal cell structure can be used for a 2-dimensional array.

NMOS transistor 100 is formed on a heavily doped N+ substrate 102. N+ substrate 102 serves as the drain electrode of the transistor. An N-type buffer layer 104 is formed on the N+ substrate 102. The N buffer layer 104 is provided to bridge the gap between the nanotube conducting channel and the N+ substrate 102, as will be described in more detail below. A lightly doped P-type epitaxial layer 106 is formed on the N+ substrate 102. In some embodiments, the N buffer layer 104 is more lightly doped than the N+ substrate 102 but more heavily doped than the P-type epitaxial layer 106. Trenches are formed in the P-type epitaxial layer 106. In the present embodiment, the trenches are formed reaching the N buffer layer 104. The trenches divide the P-type epitaxial layer 106 into mesas, referred herein as P-Mesa-Epi layer 106.

NMOS transistor 100 incorporates a superjunction structure formed on the sidewall surface of the P-Mesa-Epi layer 106. More specifically, the superjunction structure includes an N-type thin semiconductor region 110 ("N-type nanotube") sandwiched or bordered by P-type thin semiconductor regions 108 ("P-type nanotubes"). N-type nanotube 110 is formed on the sidewalls of the mesas of the P-type epitaxial layer 106 and functions as the N-type drain drift region of transistor 100. P-type nanotubes 108 are also formed on the sidewalls of the P-Mesa-Epi layer 106 on both sides of the N-type nanotube and function as nanotube body regions. Each P-type nanotube 108 has a doping concentration higher than the doping concentration of the P-Mesa-Epi layer 106. A thin epitaxial layer 112 is formed on the sidewall of the trenches and the remaining space in the trenches is filled with a dielectric layer 114, such as a silicon oxide layer. The thin epitaxial layer 112 can be undoped or very lightly doped N-type or P-type epitaxial layer. In the superjunction structure thus formed, the N-type nanotube 110 is the nanotube conduction channel while the P-type nanotubes 108 are the nanotube body regions.

A P-type body region 120 is formed in the P-Mesa-Epi layer 106 and is in electrical contact with at least the N-type nanotube 110. A polysilicon gate 118 is formed on the P-Mesa-Epi 106 and overlaps the P-body region 120. The polysilicon gate 118 may extend over the dielectric-filled trench 114. The polysilicon gate 118 is insulated from the P-body region 120 by a gate oxide layer 116. An N+ source region 122 and a P+ body contact region 124 are formed at the top portion of the P-Mesa-Epi layer 106. In particular, the N+ source region 122 is aligned to an edge of the polysilicon gate 118. A BPSG layer 126 covers the entire structure and openings are made to the P+ body contact region 124 and/or the N+ source region 122 to allow a source contact electrode 130 to be formed for making electrical connection to the source and the body of transistor 100. As thus configured, the transistor 100 has a lateral channel under the polysilicon gate 118 between the N+ source region 122 and the N-type nanotube 110 forming the drain drift region of the transistor. The channel of the transistor 100 is denoted by dotted lines in FIG. 1.

In operation, when NMOS transistor 100 is in the on-state, the N-type nanotube 110 functions as the drain drift region of the transistor with the on-resistance of the transistor being reduced by the use of the superjunction structure. When NMOS transistor 100 is in the off-state, a depletion layer expands from the P-N junction between the N-drift region 110 and the P-type nanotube 108/the P-Mesa-Epi layer 106. The N-type nanotube 110 and the P-type nanotube 108/the P-Mesa-Epi layer 106 are completely depleted to produce a balanced space charge region in the body of the transistor. In some cases, the P-Mesa-Epi layer 106 is very lightly doped so that its contribution to the charge balance is very small and the P-type nanotubes 108 provide most of the charge in the charge balance. The balanced space charge in this region allows a high breakdown voltage to be achieved. More specifically, charge balance in a later MOSFET is achieved by selecting a thickness ratio and a doping concentration ratio for the N-drift region and the P-type Nanotube/P-Mesa-Epi layer so that: $NX_n=PX_p$, where N denotes the doping concentration and $X_n$ denotes the thickness of the N-type nanotube, and P denotes the doping concentration and $X_p$ denotes the thickness of the P-type nanotube/P-Mesa-Epi layer. The charge balance allows for high doping concentrations to be used for the drain drift region to achieve low Rdson, while still attaining high breakdown voltage.

A salient feature of the superjunction structure in NMOS transistor 100 is that the N-type nanotube 110 and the P-type nanotube 108 are formed using simultaneously N and P angled implant using different implant energies and using dopant species having vastly different diffusivities or diffusion rates. In this manner, after the anneal process, implanted dopants of one conductivity type will spread out more than implanted dopants of the other conductivity types and alternating nanotube regions are thus formed. The process for forming the NMOS transistor 100 will be explained in more detail below.

Figure 2:
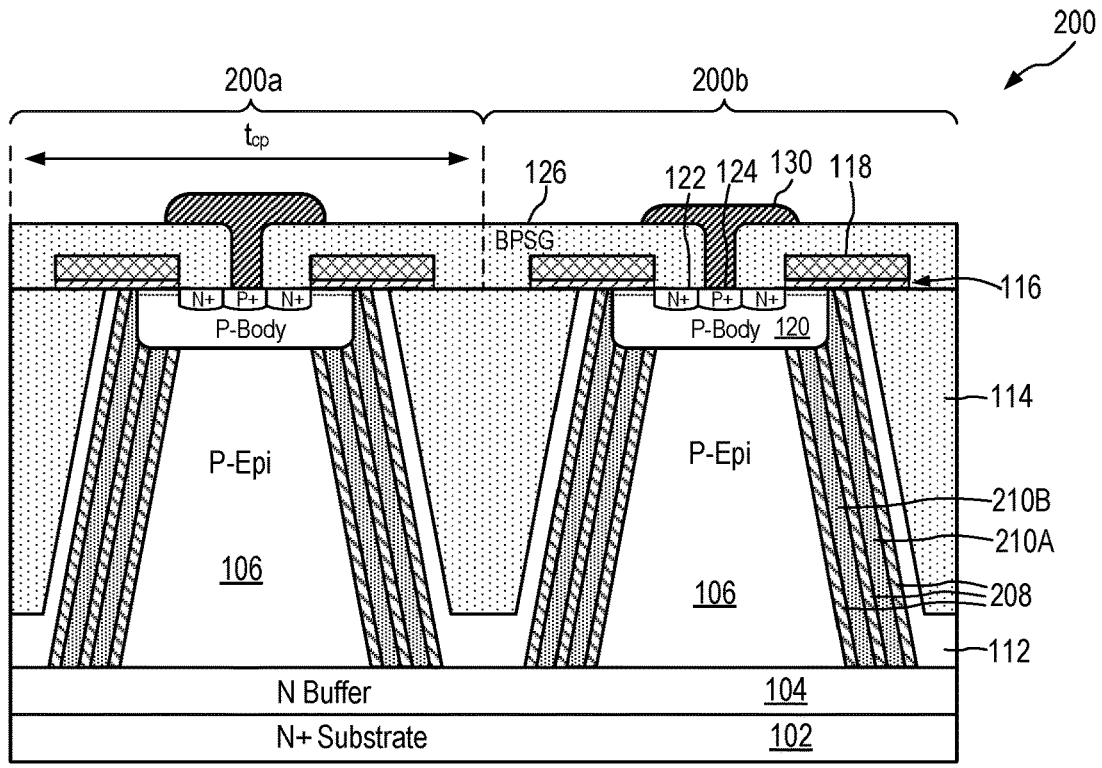
FIG. 2 is a cross-sectional view of a lateral MOSFET device according to a second embodiment of the present invention.

FIG. 2 is a cross-sectional view of a lateral MOSFET device according to a second embodiment of the present invention. Referring to FIG. 2, an N-type lateral MOSFET device ("NMOS transistor") 200 is formed in an array of parallely connected transistor cells 200a and 200b. A desired number of transistor cells are used to form the array to realize an NMOS transistor 100 having the desired breakdown voltage and Rdson (drain-to-source "On" resistance) characteristic. The transistor array can be a 1-dimensional or 2-dimensional array depending on the number of transistor cells involved. For instance, a stripe cell structure can be used for a 1-dimensional array and a hexagonal cell structure can be used for a 2-dimensional array.

NMOS transistor 200 has a similar structure as NMOS transistor 100 of FIG. 1 except for the superjunction structure. In NMOS transistor 200, the superjunction structure is formed to include multiple alternating N-type nanotube regions 210 and P-type nanotube regions 208. In this manner, the superjunction structure includes multiple conduction channels as the drain drift region which further improves the on-resistance characteristics of the transistor. In the embodiment shown in FIG. 2, the superjunction structure includes a first N-type nanotube 210A and a second N-type nanotube 210B sandwiched between P-type nanotubes 208. Each P-type nanotube 208 has a doping concentration higher than the doping concentration of the P-Mesa-Epi layer 106.

A salient feature of the superjunction structure in NMOS transistor 200 is that the nanotubes are formed using repeated N-type angled implant followed by epitaxial growth and then a final P-type implant. After the anneal process, the P-type implant spreads to form the P-type nanotubes interleaving the N-type nanotubes. The process for forming the NMOS transistor 200 will be explained in more detail below.

Figure 3A:
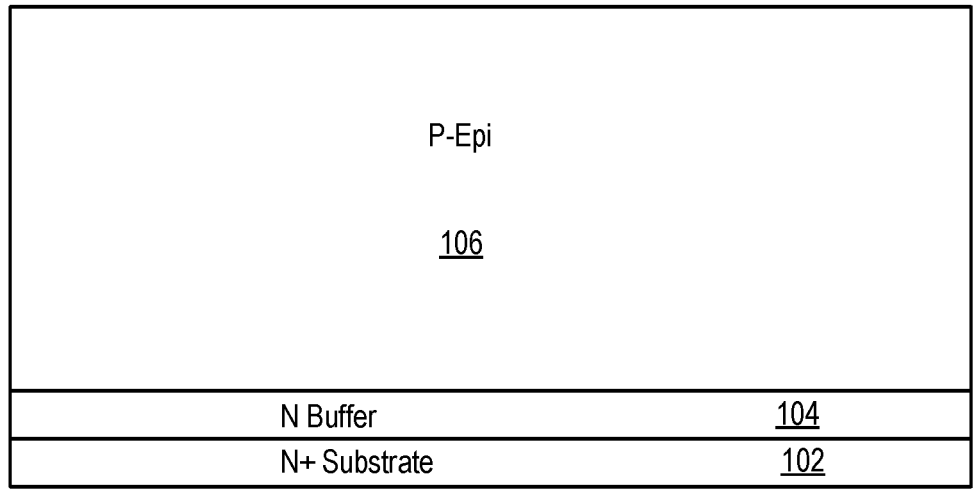
FIGS. 3(*a*)-(*h*) are cross-sectional views illustrating the fabrication process steps for forming the lateral MOSFET device of FIG. 1 according to embodiments of the present invention.
Figure 3B:
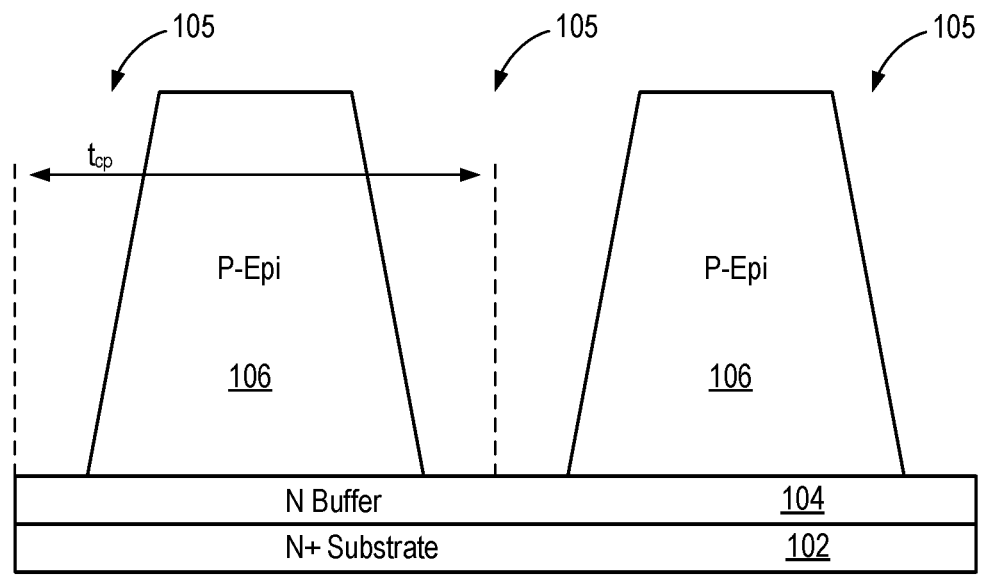

FIGS. 3(a)-(h) are cross-sectional views illustrating the fabrication process steps for forming the lateral MOSFET device of FIG. 1 according to embodiments of the present invention. The fabrication process will also be described with reference to the flowchart in FIG. 4. FIG. 4 is a flowchart illustrating the fabrication process steps for forming the lateral MOSFET device of FIG. 1 in embodiments of the present invention. Referring to FIGS. 3(a)-(h) and 4, the fabrication process 300 starts with the heavily doped N+ substrate 102. An N buffer layer 104 is formed on the N+ substrate 102. Then, at 302, a P-type epitaxial layer 106 is grown on N+ substrate 102, as shown in FIG. 3(a). Then, at 304, the structure is subjected to masking and anisotropic etching to form trenches 105 in the P-type epitaxial layer 106, as shown in FIG. 3(b). As a result of the trench formation, mesas are formed and the P-type epitaxial layer is now referred to as P-Mesa-Epi layer 106. The trenches extend all the way through the P-Mesa-Epi layer 106 to the N buffer layer 104. The exact depth of the trenches is not critical except that the bottom of the trench should be close to the N buffer layer 104 enough to allow the N buffer layer to counter-dope the bottoms of the subsequently formed N-type thin semiconductor region, as will be described in more detail below. In some embodiments, the trenches are formed extending close to, up to, or into the N buffer layer 104.

In embodiments of the present invention, the trenches 105 are formed with tapered sidewall. That is, the trench sidewall does not form a perpendicular angle with the N buffer layer 104 but rather the trench sidewall has an angle greater than 90° relative to the N buffer layer 104. As a result, the mesa thus formed has a trapezoidal shape with the top of the mesa having a smaller width than the bottom of the mesa. In one embodiment, the sidewall of the mesa forms an angle of 89° or less with the N-buffer layer 104. The doping level of P-Mesa-Epi layer 106 is selected to achieve a balanced space charge when depleted under reverse bias and is in part a function of the width of the mesas.

In some embodiments, the N+ substrate 102 may have a doping concentration of $3 \times 10^{19}$ cm$^{-3}$ and the N buffer layer 104 may have a thickness of 1 µm and a doping concentration of $5 \times 10^{16}$ cm$^{-3}$. The P-Mesa-Epi Layer 106 may have a thickness of 35-40 µm and a doping concentration of $4 \times 10^{14}$ cm$^{-3}$. The cell pitch $t_{cp}$ may be about 12 µm with the trench 105 having a width of about 9 µm and the mesa having a width of about 3 µm.

Figure 3C:
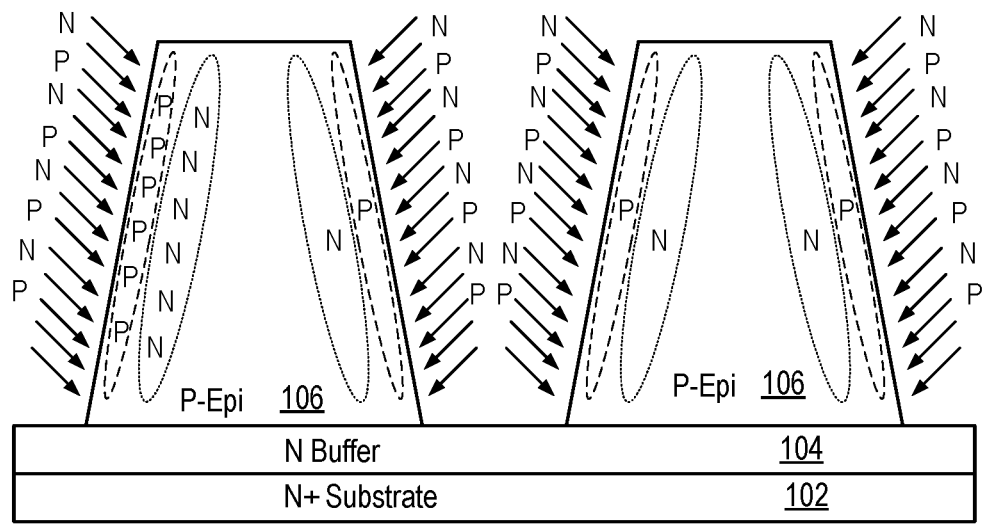
Figure 4:
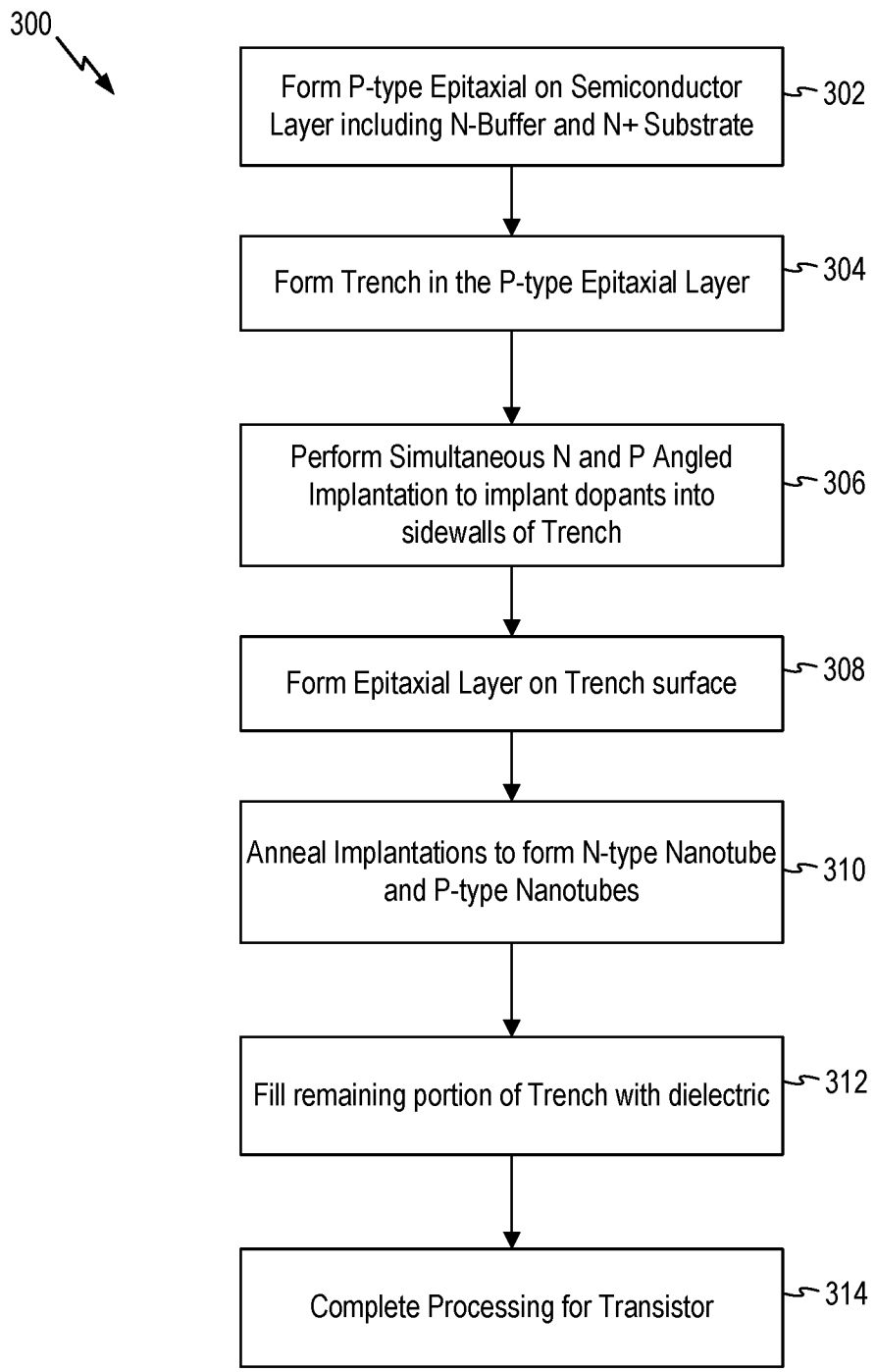
FIG. 4 is a flowchart illustrating the fabrication process steps for forming the lateral MOSFET device of FIG. 1 in embodiments of the present invention.

With the trenches thus formed, at 306, simultaneous N and P angled implantation is performed to implant N-type and P-type dopants into the sidewalls of the trenches 105, as shown in FIG. 3(c). More specifically, the implant angle, the dopant types and implant energy for each dopant type are selected so that after subsequent annealing, the implant dopants form sandwiched N-type and P-type thin semiconductor regions on the sidewall of the mesa.

In embodiments of the present invention, simultaneous N and P angled implantation refers to implantation of the N-type and P-type dopants either at the same time or one dopant type after another dopant type without any intervening anneal step. Thus, in some embodiments, the N-type dopants and the P-type dopants are introduced at the same time using different implant energies. In other embodiments, N-type implantation and P-type implantation are carried out sequentially with different implant energies and without any annealing step in between.

In embodiments of the present invention, the implant is carried out at a shallow angle, such as less than 20° from the central vertical axis of the trenches, as shown schematically by the arrows in FIG. 3(c). In one embodiment, the implant angle is 15° from the central vertical axis of the trenches. During the implantation process, the wafer may be rotated so that the implant will be equally distributed over all surfaces of the trenches.

In embodiments of the present invention, the implant species for P-type dopants are selected to have greater diffusion rate (or diffusivity) and lighter atomic mass than that of the implant species for N-type dopants. Meanwhile, the implant energy for the P-type dopants is selected to be much lower than the implant energy for the N-type dopants. As a result, P-type dopants are implanted near the sidewall surface of the P-Mesa-Epi layer 106 while the N-type dopants are implanted deeper into the P-Mesa-Epi layer 106, as shown in FIG. 3(c). However, subsequent annealing of the implanted dopants will result in the P-type dopants spreading out and diffusing deeper into the P-Mesa-Epi layer while the N-type dopants remaining close to where they are implanted. In this manner, an N-type semiconductor region sandwiched between P-type semiconductor regions is formed.

In one embodiment, the implant species for P-type dopants is boron (B) and the implant species for N-type dopants is arsenic (As). Furthermore, in one embodiment, for the boron implant, an implant energy of 100 keV and an implant dose of $1.25 \times 10^{13}$ cm$^{-3}$ are used. In one embodiment, for the arsenic implant, an implant energy of 500 keV and an implant dose of $1.25 \times 10^{13}$ cm$^{-3}$ are used.

Figure 3D:
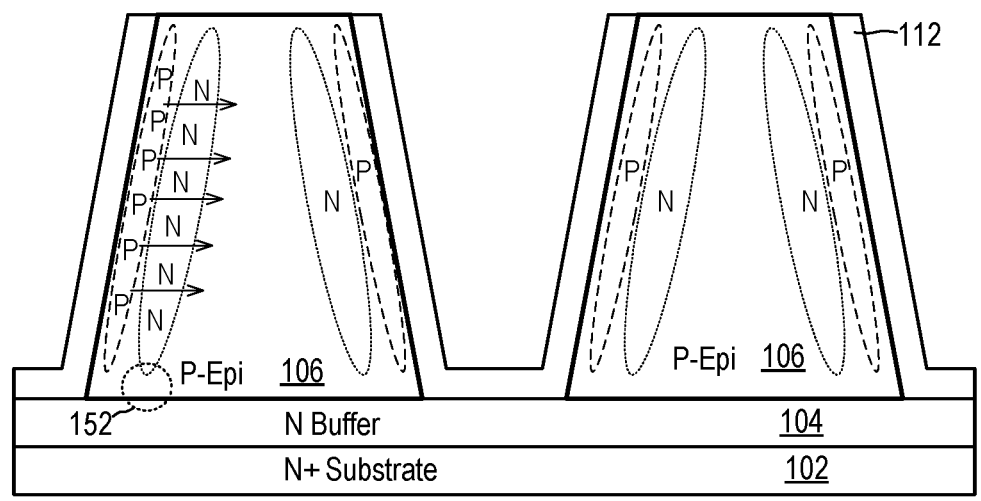

At 308, with the P-type and N-type dopants thus implanted, an epitaxial layer 112 is formed on the trench surface, as shown in FIG. 3(d). The epitaxial layer 112 can be undoped or a very lightly doped N-type or P-type epitaxial layer. Then, at 310, the semiconductor structure is annealed to form an N-type nanotube region and P-type nanotube regions. During the annealing process, the P-type dopants with lighter atomic mass and higher diffusivity diffuses or spreads into the P-Mesa-Epi layer 106, passing the region implanted with N-type dopants. Meanwhile, the N-type dopants with lower diffusivity will anneal but the dopants will remain in the vicinity of the implanted region, as shown in FIG. 3(d). During the diffusion process, the epitaxial layer 112 formed on the trench surface helps the diffusion of the P-type dopants into the P-Mesa-Epi layer. In some embodiments, the epitaxial layer 112 is a very lightly doped P-type epitaxial layer and has a thickness of 1-2 µm.

Figure 3E:
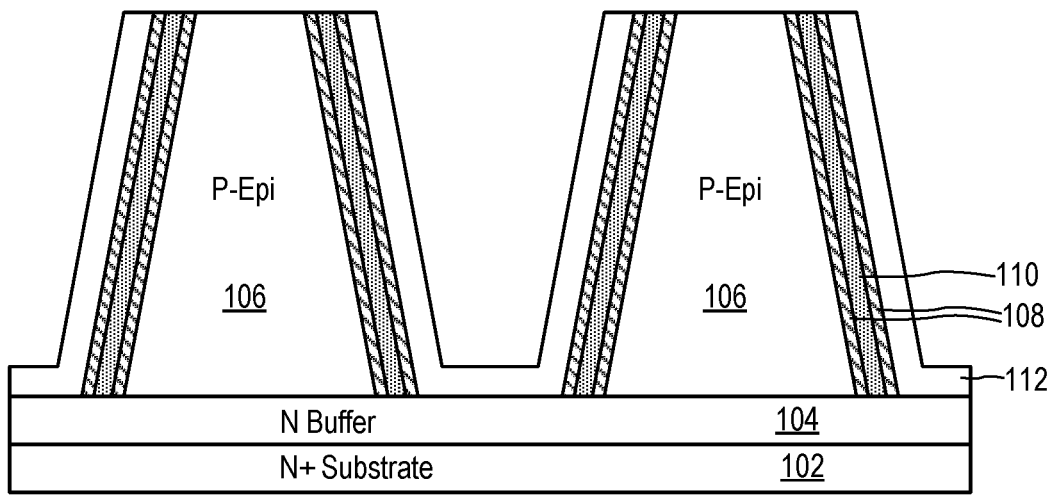
Figure 3F:
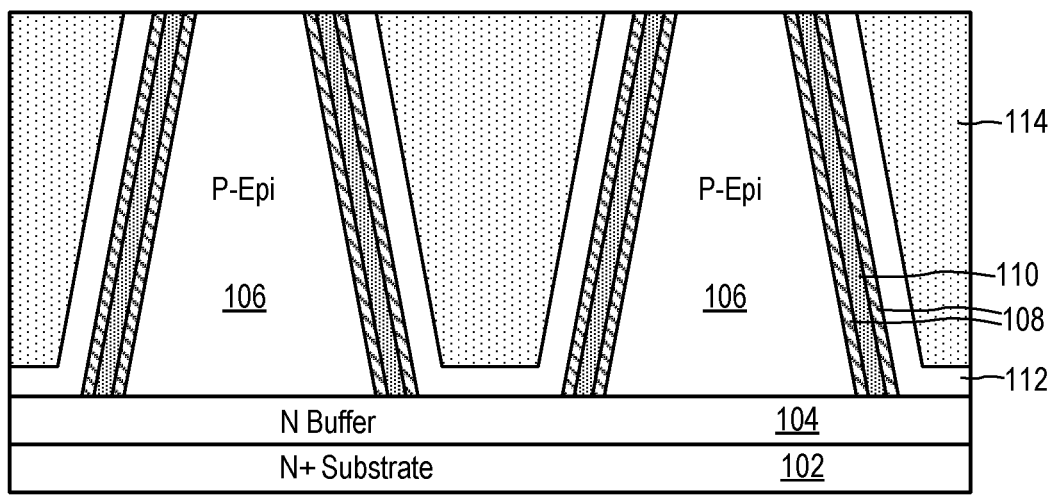

As a result of the annealing process, N-type nanotube 110 and P-type nanotubes 108 are formed, as shown in FIG. 3(e). Each P-type nanotube 108 has a doping concentration higher than the doping concentration of the P-Mesa-Epi layer 106. At 312, the remaining portions of the trenches may be filled with a dielectric layer 114, such as a silicon oxide layer, as shown in FIG. 3(f). In some embodiments, the epitaxial layer 112 may be formed to fill the trenches and then after annealing, the epitaxial layer 112 is etched back in the trenches and the exposed portions of the trenches are filled with the dielectric layer 114, such as a silicon oxide layer.

In some embodiments, the angled implant into the trenches may not be able to implant sufficient dopants to the lower portion of the trenches. In order to ensure a reliable connection between the N-type nanotube and the underlying N+ substrate 102, the N buffer layer 104 is used to provide out-diffusion of N-type dopants during the anneal process to help the N-type nanotube to link up with the N+ substrate 102. Accordingly, during the anneal process, N-type dopants from the N buffer layer 104 will out-diffuse up to connect to the N-type semiconductor region formed by the N-type implanted dopants. In this manner, the N-type nanotube 110 is linked to the N+ substrate 102.

Figure 3G:
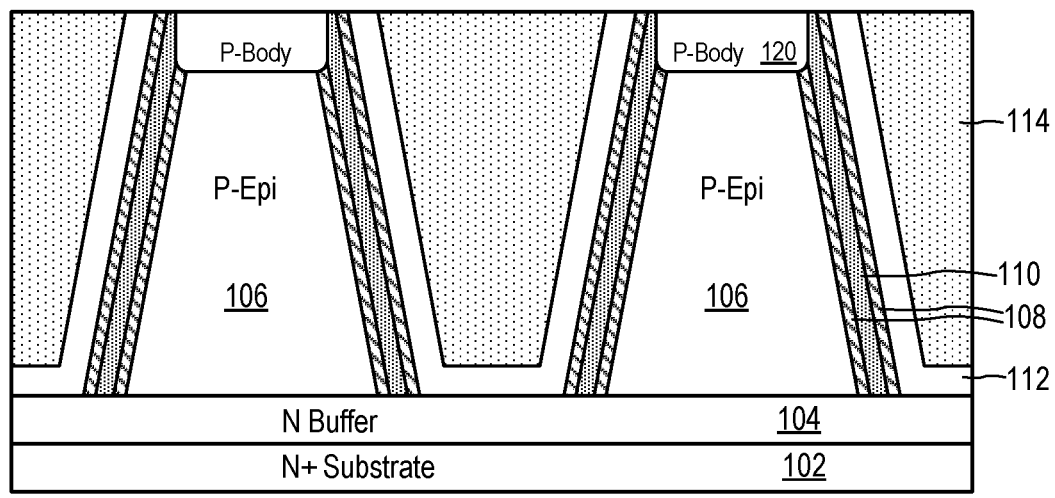
Figure 3H:
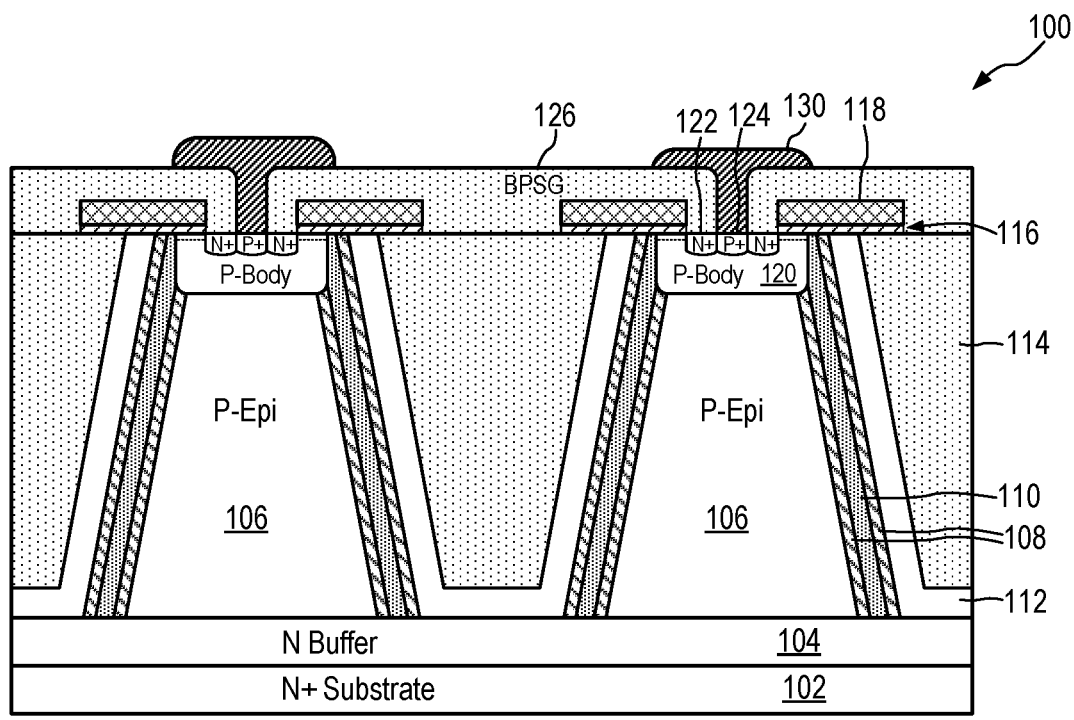

At 314, the remaining processing steps to complete the transistor structure are carried out. For example, subsequent to the trench dielectric oxide deposition (FIG. 3(f)), a chemical mechanical polishing (CMP) process may be carried out to planarize the surface of the semiconductor structure. The CMP process may remove the excess oxide and the thin epitaxial layer 112 which may be formed on the top of the mesas of the P-Mesa-Epi layer 106. Then, an ion implantation process is carried out to form the P-body region 120 at a top portion of the mesas of the P-Mesa-Epi layer 106, as shown in FIG. 3(g). Referring to FIG. 3(h), a gate oxide layer 116 is grown on the P-Mesa-Epi layer 106 and may extend over the trench structure. In some embodiments, the gate oxide layer 116 is grown using a low temperature process to prevent out-diffusion of the N-type and P-type thin semiconductor regions 110 and 108.

Then, a polysilicon layer is deposited and patterned to form a polysilicon gate electrode 118. Subsequently, an ion implantation is carried out to form the N+ source regions 122. The source regions 122 are formed in the body regions 120 and are self-aligned to the polysilicon gate electrode 118. Finally, another ion implantation is carried out to form the P+ body contact region 124 adjacent the source regions 122, as shown in FIG. 3(h). A dielectric layer 126, such as BPSG, is deposited to cover the entire semiconductor structure. In some embodiments, the BPSG layer is planarized by a chemical mechanical polishing process and then contact openings are made in the BPSG layer 126 to expose at least the P+ body contact region 124 and may be partially the N+ source region 122. A metal layer is deposited and patterned to form the source electrode 130. A passivation layer (not shown) is then deposited over the entire semiconductor structure to passivate the NMOS transistor 100.

The fabrication process for forming the lateral MOSFET device 100 realizes many advantages over conventional processes. In particular, the fabrication process enables the cell pitch for performing the angled implant to be relaxed. That is, the trench width can be made wider so that the angled implant can be performed more easily. More specifically, in the NMOS transistor 100, the fabrication process of the present invention enables thin P-type nanotube regions to be formed on both sides of the N-type nanotube. As a result, the N-type nanotube can be formed with a wider thickness or high doping concentration to carry more charge per cell pitch. Accordingly, the cell pitch of the transistor can be relaxed to accommodate the angled implant without compromising the performance of the transistor.

As described above with reference to FIG. 2, the semiconductor device of the present invention can be formed using a superjunction structure that includes multiple nanotubes forming multiple conduction channels. The on-resistance of the semiconductor device can be improved with the provision of the additional conduction channels.

Figure 5A:
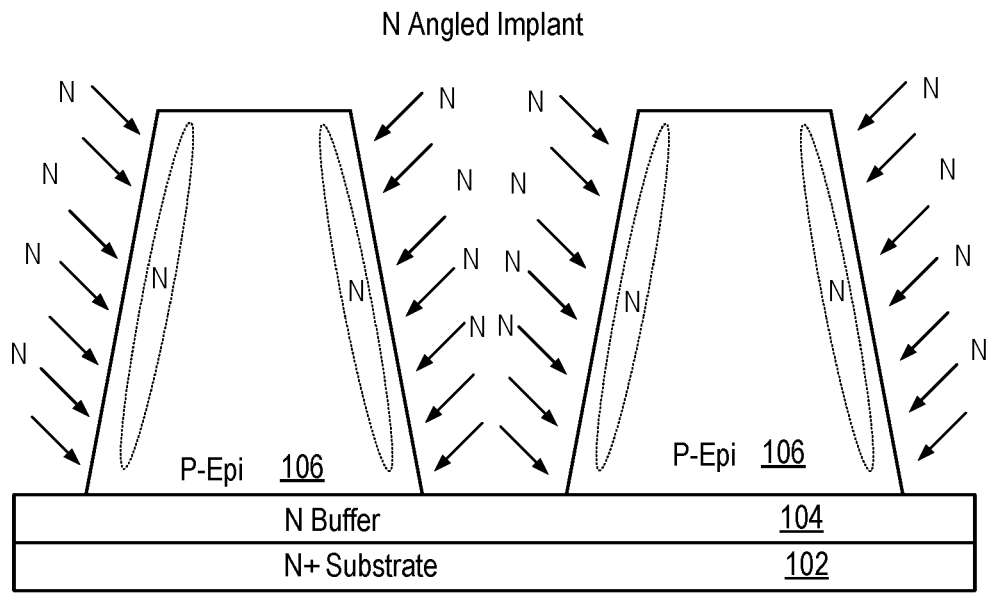
FIGS. 5(*a*)-(*h*) are cross-sectional views illustrating the fabrication process steps for forming the lateral MOSFET device of FIG. 2 according to embodiments of the present invention.
Figure 5B:
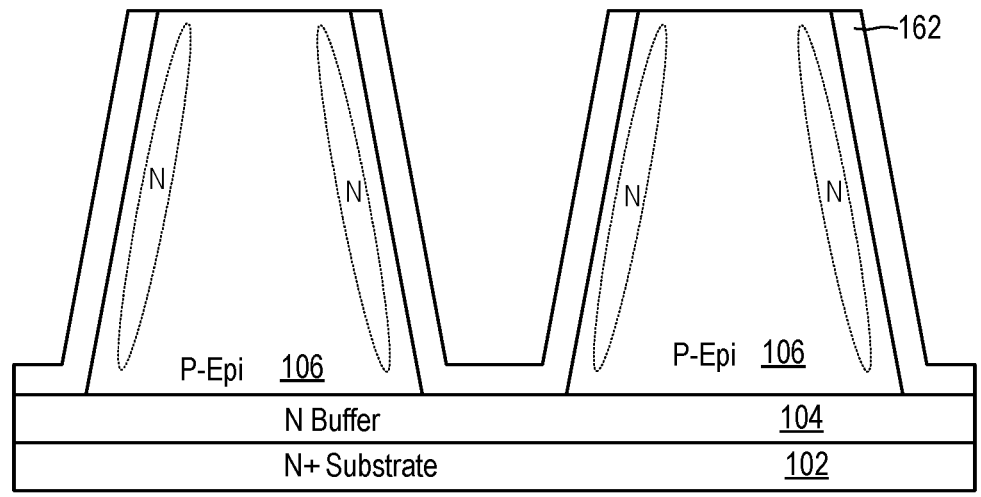
Figure 5C:
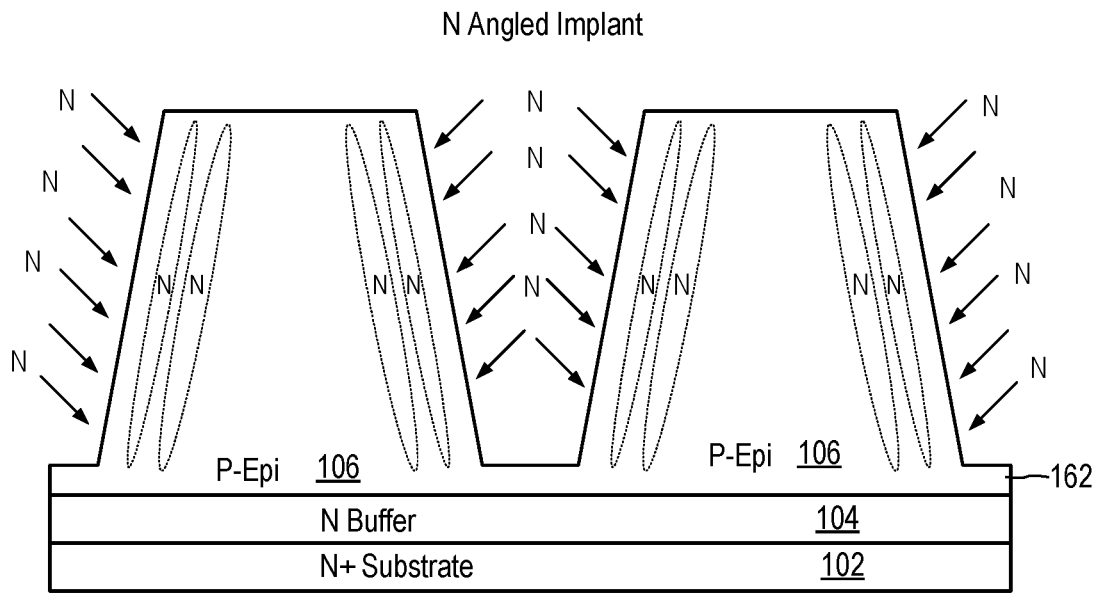

FIGS. 5(a)-(h) are cross-sectional views illustrating the fabrication process steps for forming the lateral MOSFET device of FIG. 2 according to embodiments of the present invention. The fabrication process will also be described with reference to the flowchart in FIG. 6. FIG. 6 is a flowchart illustrating the fabrication process steps for forming the lateral MOSFET device of FIG. 2 in embodiments of the present invention. Referring to FIGS. 5(a)-(h) and 6, the fabrication process 400 starts with the heavily doped N+ substrate 102. At 402, an N buffer layer 104 is formed on the N+ substrate 102 and a P-type epitaxial layer 106 is grown on N+ substrate 102. Then, at 404, the structure is subjected to masking and anisotropic etching to form trenches in the P-type epitaxial layer 106, as shown in FIG. 5(a). As a result of the trench formation, mesas are formed and the P-type epitaxial layer is now referred to as P-Mesa-Epi layer 106. The trenches extend all the way through the P-Mesa-Epi layer 106 to the N buffer layer 104. The exact depth of the trenches is not critical except that the bottom of the trench should be close to the N buffer layer 104 enough to allow the N buffer layer to counter-dope the bottoms of the subsequently formed N-type thin semiconductor regions. In some embodiments, the trenches are formed extending close to, up to, or into the N buffer layer 104.

In embodiments of the present invention, the trenches are formed with tapered sidewall. That is, the trench sidewall does not form a perpendicular angle with the N buffer layer 104 but rather the trench sidewall has an angle greater than 90° relative to the N buffer layer 104. As a result, the mesa thus formed has a trapezoidal shape with the top of the mesa having a smaller width than the bottom of the mesa. In one embodiment, the sidewall of the mesa forms an angle of 89° or less with the N-buffer layer 104. The doping level of P-Mesa-Epi layer 106 is selected to achieve a balanced space charge when depleted under reverse bias and is in part a function of the width of the mesas. In some embodiments, the N+ substrate 102, the N buffer layer 104 and the P-Mesa-Epi layer 106 are formed with thicknesses and doping concentration values similar to that of NMOS transistor 100 of FIG. 1 and described above with reference to FIGS. 3(a) to 3(h).

With the trenches thus formed, at 406, N-type angled implantation is performed to implant N-type dopants into the sidewalls of the trenches, as shown in FIG. 5(a). More specifically, the implant angle, the dopant type and implant energy are selected so that the N-type dopants are implanted near the trench sidewall surface of the P-Mesa-Epi layer 106. Then, at 408, an epitaxial layer 162 is formed on the trench surface, as shown in FIG. 5(b). In some embodiments, the epitaxial layer 162 is an undoped epitaxial layer. Then, at 410, a second N-type angled implantation is performed to implant N-type dopants into the sidewalls of the trenches, as shown in FIG. 5(c). As a result, two N-type implanted regions are formed which will form two conduction channels after annealing. When additional conduction channels are desired, the steps of performing N-type angled implant (410) followed by forming an epitaxial layer on the trench sidewall (408) can be repeated.

Figure 5D:
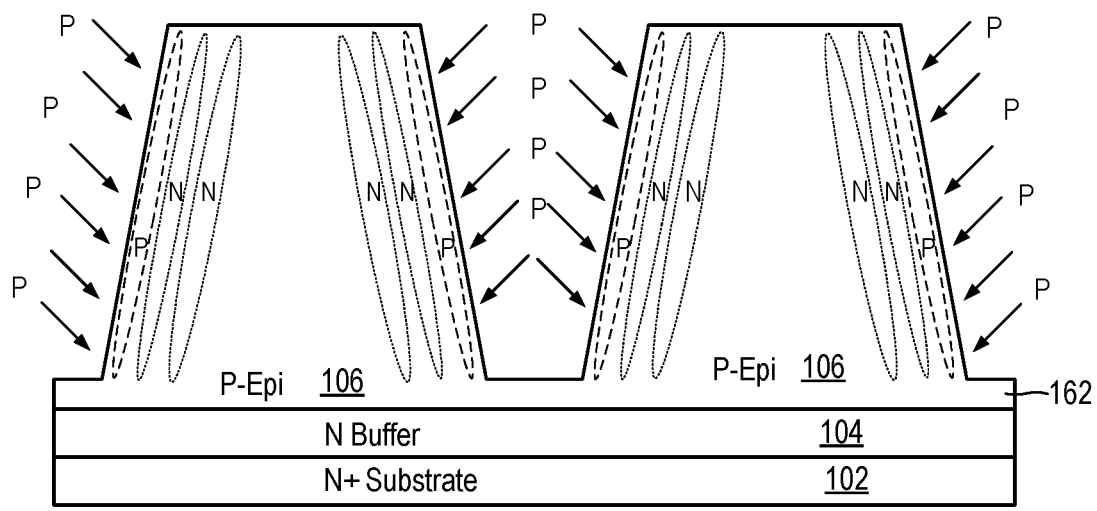
Figure 6:
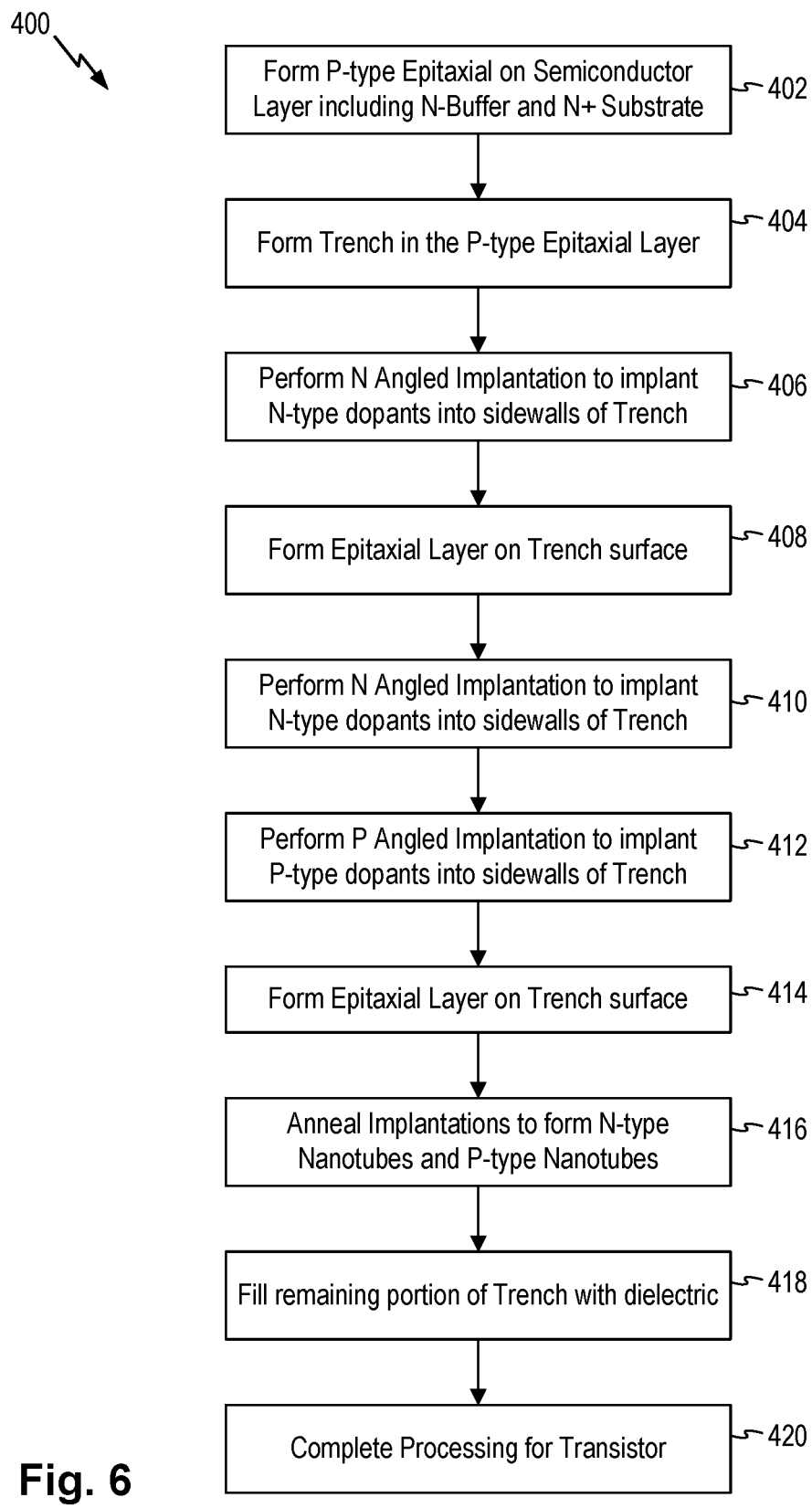
FIG. 6 is a flowchart illustrating the fabrication process steps for forming the lateral MOSFET device of FIG. 2 in embodiments of the present invention.

After the final N-type implantation, method 400 continues at 412 to perform a P-type angled implantation to implant P-type dopants into the sidewalls of the trenches, as shown in FIG. 5(d). In embodiments of the present invention, both the N-type and P-type implants are carried out at a shallow angle, such as less than 20° from the central vertical axis of the trenches. In one embodiment, the implant angle is 15° from the central vertical axis of the trenches. During the implantation process, the wafer may be rotated so that the implant will be equally distributed over all surfaces of the trenches.

In embodiments of the present invention, the implant species for P-type dopants is selected to have greater diffusion rate (or diffusivity) and lighter atomic mass than that of the implant species for N-type dopants. Meanwhile, the implant energy for the P-type dopants is selected to be lower than the implant energy of the last N-type implantation. As a result, P-type dopants are implanted near the sidewall surface of the P-Mesa-Epi layer 106 and the thin epitaxial layer 162 formed thereon. The N-type dopants are positioned deeper into the P-Mesa-Epi layer 106, as shown in FIG. 5(d). The N-type dopants are positioned deeper into the P-Mesa-Epi layer 106 due to the successive implantation and epitaxial process and due to the higher implant energy used for the last N-type implantation. Subsequent annealing of the implanted dopants will result in the P-type dopants spreading out and diffusing deeper into the P-Mesa-Epi layer while the N-type dopants remaining close to where they are implanted. In this manner, an N-type semiconductor regions sandwiched between P-type semiconductor regions are formed. In one embodiment, the implant species for P-type dopants is boron (B) and the implant species for N-type dopants is arsenic (As).

Figure 5E:
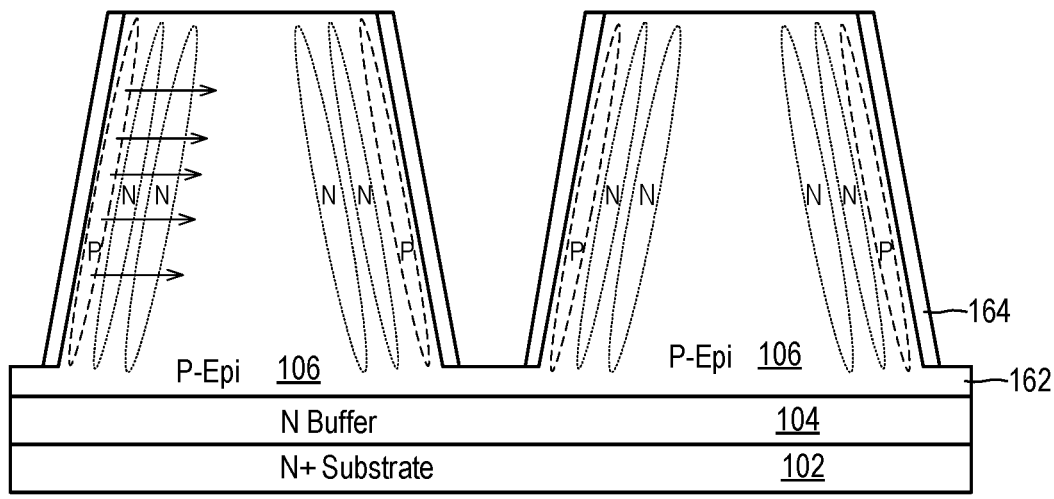

At 414, with the P-type and N-type dopants thus implanted, an epitaxial layer 164 is formed on the trench surface, as shown in FIG. 5(e). The epitaxial layer 164 can be undoped or a very lightly doped N-type or P-type epitaxial layer. Then, at 416, the semiconductor structure is annealed to form an N-type nanotube regions and P-type nanotube regions. During the annealing process, the P-type dopants with lighter atomic mass and higher diffusivity diffuses or spreads into the P-Mesa-Epi layer 106, passing the regions implanted with N-type dopants. Meanwhile, the N-type dopants with lower diffusivity will anneal but the dopants will remain in the vicinity of the original implanted regions, as shown in FIG. 5(e). During the diffusion process, the epitaxial layer 164 formed on the trench surface helps the diffusion of the P-type dopants into the P-Mesa-Epi layer. In some embodiments, the epitaxial layer 164 is a lightly doped P-type epitaxial layer and has a thickness of 1-2 µm.

Figure 5F:
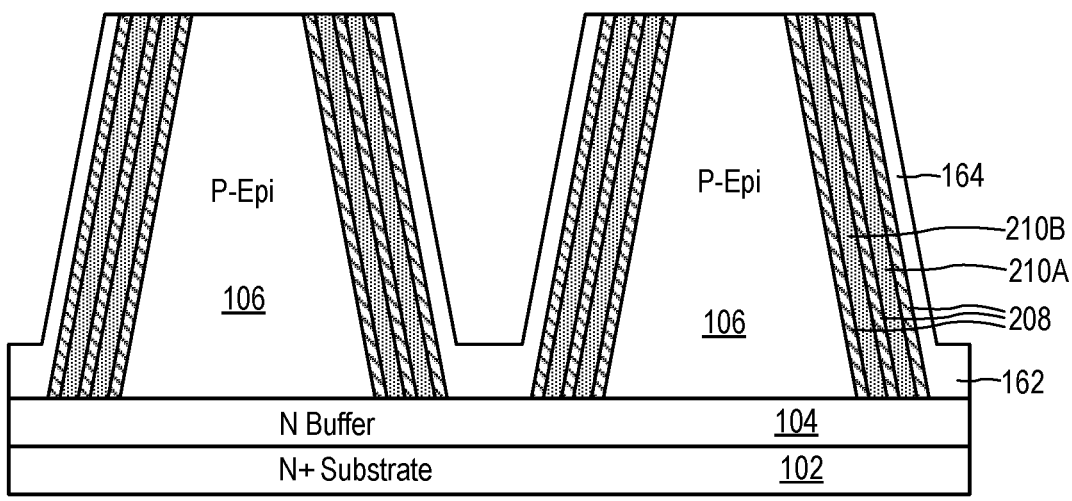
Figure 5G:
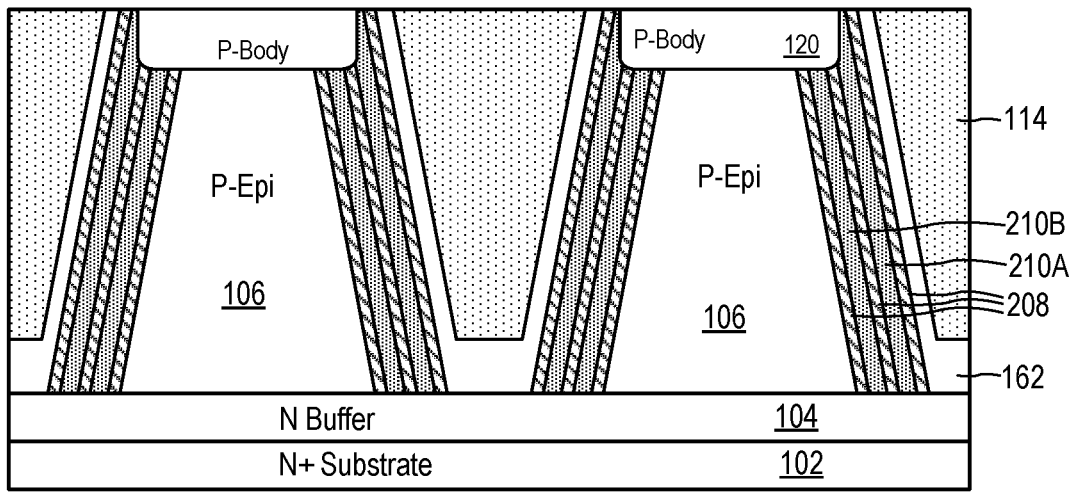

As a result of the annealing process, N-type nanotube 210A and 210B and P-type nanotubes 208 are formed, as shown in FIG. 5(f). Each P-type nanotube 208 has a doping concentration higher than the doping concentration of the P-Mesa-Epi layer 106. At 418, the remaining portions of the trenches may be filled with a dielectric layer 114, such as a silicon oxide layer, as shown in FIG. 5(g). In some embodiments, the epitaxial layer 164 may be formed to fill the trenches and then after annealing, the epitaxial layer 164 is etched back in the trenches and the exposed portions of the trenches are filled with the dielectric layer 114, such as a silicon oxide layer.

In some embodiments, the angled implant into the trenches may not be able to implant sufficient dopants to the lower portion of the trenches. In order to ensure a reliable connection between the N-type nanotubes and the underlying N+ substrate 102, the N buffer layer 104 is used to provide out-diffusion of N-type dopants during the anneal process to help the N-type nanotubes to link up with the N+ substrate 102. Accordingly, during the anneal process, N-type dopants from the N buffer layer 104 will out-diffuse up to connect to the N-type semiconductor regions 210A and 210B formed by the N-type implanted dopants. In this manner, the N-type nanotubes 210A and 210B are linked to the N+ substrate 102.

Figure 5H:
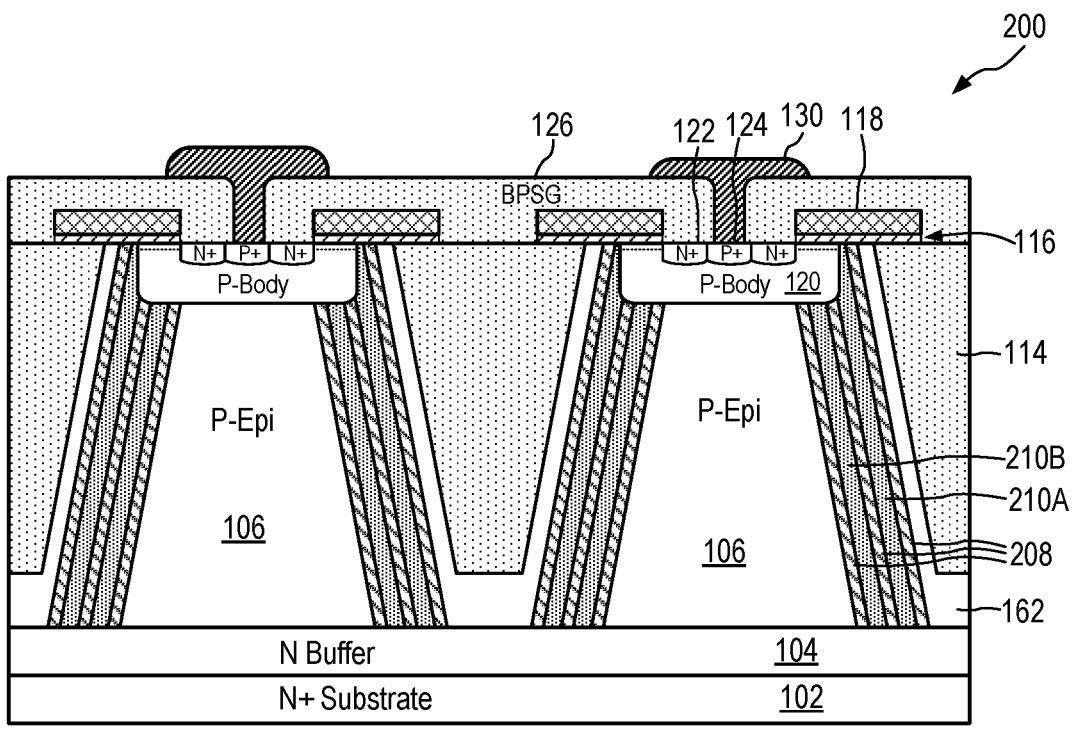

At 420, the remaining processing steps to complete the transistor structure are carried out. For example, subsequent to the trench dielectric oxide deposition, a chemical mechanical polishing (CMP) process may be carried out to planarize the surface of the semiconductor structure. The CMP process may remove the excess oxide and the thin epitaxial layer 164 which may be formed on the top of the mesas of the P-Mesa-Epi layer 106. Then, an ion implantation process is carried out to form the P-body region 120 at a top portion of the mesas of the P-Mesa-Epi layer 106, as shown in FIG. 5(g). Referring to FIG. 5(h), a gate oxide layer 116 is grown on the P-Mesa-Epi layer 106 and may extend over the trench structure. In some embodiments, the gate oxide layer 116 is grown using a low temperature process to prevent out-diffusion of the N-type and P-type thin semiconductor regions 210 and 208.

Then, a polysilicon layer is deposited and patterned to form a polysilicon gate electrode 118. Subsequently, an ion implantation is carried out to form the N+ source regions 122. The source regions 122 are formed in the body regions 120 and are self-aligned to the polysilicon gate electrode 118. Finally, another ion implantation is carried out to form the P+ body contact region 124 adjacent the source regions 122, as shown in FIG. 5(h). A dielectric layer 126, such as BPSG, is deposited to cover the entire semiconductor structure. In some embodiments, the BPSG layer is planarized by a chemical mechanical polishing process and then contact openings are made in the BPSG layer 126 to expose at least the P+ body contact region 124 and may be partially the N+ source region 122. A metal layer is deposited and patterned to form the source electrode 130. A passivation layer (not shown) is then deposited over the entire semiconductor structure to passivate the NMOS transistor 200.

In the above described embodiments, the process for forming N-type MOSFET devices are described. Furthermore, arsenic (As) is used as the N-type dopant and boron (B) is used as the P-type dopant. The selection of the dopants provides the particular advantage of enabling the P-type dopant to be spread out more than the N-type dopant to form the sandwiched N-type nanotube. In other embodiments, the process can be used to form P-type MOSFET device with the appropriate change in dopant polarities. For example, to form P-type conducting channels in the superjunction structure, gallium (Ga) may be used as the P-type dopant and phosphorus (P) may be used as the N-type dopant. The N-type dopant will diffuse further and spread out more than the P-type dopant to form bordering N-type nanotubes around the P-type nanotubes.

Semiconductor devices incorporating the superjunction structure constructed as described above provide many advantages. First, by using implanted regions to form the nanotubes, the charge in the superjunction structure is controlled by the implantation process. In some cases, doping by ion implantation can be tightly controlled and better than epitaxial growth. Second, because the conduction channel nanotube is sandwiched between the body nanotubes, the charge in the conduction channel nanotube increases and the on-resistance decreases. It is then possible to relax the cell pitch to make the angle implant process easier.

The above described embodiments are directed to forming superjunction structures in N-channel MOSFET devices. However, the superjunction structures described above can be applied to form P-channel MOSFET devices by reversing the polarities of conductivity types used for each semiconductor region. Furthermore, the superjunction structures described above can be applied to form other semiconductor devices, such as diodes.

Furthermore, in the above described embodiments, an N buffer layer is formed on the semiconductor substrate before the P-type epitaxial layer is formed. In some embodiments, the buffer layer may be omitted and the P-epitaxial layer can be formed directly on the semiconductor substrate.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for forming a semiconductor device comprising:
   providing a heavily doped semiconductor substrate of a first conductivity type;
   forming a buffer layer of the first conductivity type on the semiconductor substrate;
   forming a semiconductor layer of a second conductivity type on the buffer layer;
   forming a plurality of trenches in the semiconductor layer, the trenches extending close to, up to, or into the buffer layer, the trenches forming mesas in the semiconductor layer;
   performing an ion implantation of dopants of the first conductivity type and dopants of the second conductivity type directed to sidewall surfaces of the plurality of trenches, the ion implantation being performed at an angle relative to the central vertical axis of the trenches and using a first implant energy for the dopants of the first conductivity type greater than a second implant energy for dopants of the second conductivity type, the dopants of the second conductivity type having a diffusion rate greater than the diffusion rate of the dopants of the first conductivity type;
   forming an epitaxial layer on the sidewall surfaces of the plurality of trenches after the ion implantation;
   annealing the implanted dopants to form a first thin semiconductor region of the first conductivity type sandwiched between second thin semiconductor regions of the second conductivity type, the first and second thin semiconductor regions being formed near the trench sidewall surface of the mesas; and
   forming a first dielectric layer in the trenches, the first dielectric layer filling at least part of the trenches,
   wherein the first thin semiconductor region has a first thickness and a first doping concentration, the second thin semiconductor regions having a second thickness and a second doping concentration, and the mesa of the semiconductor layer having a third thickness and a third doping concentration, the first, second and third thicknesses and the first, second and third doping concentrations being selected to achieve charge balance in operation.

2. The method of claim 1, further comprising:
   forming a body region of the second conductivity type in a top portion of at least a first mesa of the semiconductor layer;
   forming a gate dielectric layer on the first mesa of the semiconductor layer above the body region;
   forming a gate conductive layer above the gate dielectric layer as the gate electrode; and
   forming a heavily doped source region of the first conductivity type in the body region aligned to the gate conductive layer,
   wherein a lateral MOSFET is formed with the semiconductor substrate being a drain region, the first thin semiconductor region being a drain drift region, the channel region of the lateral MOSFET being formed in the body region between the source region and the drain drift region.

3. The method of claim 1, performing an ion implantation of dopants of the first conductivity type and dopants of the second conductivity type comprises:
   performing the ion implantation of dopants of the first conductivity type and dopants of the second conductivity type simultaneously.

4. The method of claim 1, performing an ion implantation of dopants of the first conductivity type and dopants of the second conductivity type comprises:
   performing the ion implantation of dopants of the first conductivity type and dopants of the second conductivity type sequentially without performing any annealing in between the sequential ion implantations.

5. The method of claim 1, wherein annealing the implanted dopants to form a first thin semiconductor region of the first conductivity type comprises:
   annealing the implanted dopants to form the first thin semiconductor region of the first conductivity type, the buffer layer out-diffusing into the mesa of the semiconductor layer to electrically connect the first thin semiconductor region to the semiconductor substrate.

6. The method of claim 1, wherein the first conductivity type comprises N-type conductivity and the second conductivity type comprises P-type conductivity.

7. The method of claim 6, wherein the dopants of the first conductivity type comprises arsenic and the dopants of the second conductivity type comprises boron.

8. The method of claim 1, wherein the first conductivity type comprises P-type conductivity and the second conductivity type comprises N-type conductivity.

9. The method of claim 1, wherein performing an ion implantation of dopants of the first conductivity type and dopants of the second conductivity type directed to sidewall surfaces of the plurality of trenches comprises:
   performing the ion implantation at an angle relative to the central vertical axis of the trenches, the angle being less than 20 degrees.

10. The method of claim 1, wherein performing an ion implantation of dopants of the first conductivity type and dopants of the second conductivity type directed to sidewall surfaces of the plurality of trenches comprises:
    performing the ion implantation to form implanted dopants of the second conductivity type in the mesas and near the sidewall surface of the trenches and to form implanted dopants of the first conductivity type in the mesas and deeper from the sidewall surface of the trenches as compared to the implanted dopants of the second conductivity type.

11. The method of claim 1, wherein forming an epitaxial layer on the sidewall surfaces of the plurality of trenches comprises:
    forming an epitaxial layer being undoped or lightly doped of the first or second conductivity type.

12. The method of claim 1, wherein forming a plurality of trenches in the semiconductor layer comprises:
    forming the plurality of trenches in the semiconductor layer having tapered sidewall, the sidewall of the mesas having an angle of less than perpendicular with the buffer layer.

13. The method of claim 7, wherein the first implant energy for the arsenic dopants is 500 keV and the second implant energy for the boron dopants is 100 keV.

* * * * *